United States Patent
Chin et al.

(10) Patent No.: US 9,577,506 B1
(45) Date of Patent: Feb. 21, 2017

(54) HIGH-SIDE CIRCUITS WITH MODIFIED DIODE AND LAYOUT PLACEMENT THEREOF

(71) Applicant: Vanguard International Semiconductor Corporation, Hsinchu (TW)

(72) Inventors: Yu-Lung Chin, Tainan (TW); Shin-Cheng Lin, Tainan (TW); Wen-Hsin Lin, Jhubei (TW); Yu-Hao Ho, Keelung (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 14/981,226

(22) Filed: Dec. 28, 2015

(30) Foreign Application Priority Data

Aug. 20, 2015 (TW) .............................. 104127103 A (51) Int. Cl.
*H02M 1/08* (2006.01)
*H02M 1/088* (2006.01)
*H02M 1/00* (2006.01)

(52) U.S. Cl.
CPC ..... *H02M 1/088* (2013.01); *H02M 2001/0003* (2013.01)

(58) Field of Classification Search
CPC ........ H01L 27/13; H01L 27/06; H01L 27/085; H01L 27/0886; H01L 27/105; H01L 27/1211; H01L 27/15; H02M 3/158; H02M 1/44; H02M 3/335; H02M 1/38; H02M 3/07; H02M 3/1588

USPC .......................... 327/108, 109, 110, 111, 112
See application file for complete search history.

(56) References Cited

U.S. PATENT DOCUMENTS

| | | | | |
|---|---|---|---|---|
| 6,353,345 B1 * | 3/2002 | Yushan | ............... | H03K 17/6871 326/80 |
| 6,825,700 B2 * | 11/2004 | Hano | ................... | H01L 27/0629 257/E27.016 |
| 2010/0271079 A1 * | 10/2010 | Choi | .................... | H03K 17/063 327/108 |

(Continued)

FOREIGN PATENT DOCUMENTS

| TW | 200845544 A | 11/2008 |
|---|---|---|
| TW | 201145775 A1 | 12/2011 |

(Continued)

*Primary Examiner* — John Poos
(74) *Attorney, Agent, or Firm* — Birch, Stewart, Kolasch & Birch, LLP (57) ABSTRACT

A high-side circuit, adapted for a switched-mode converter, includes a level shifter, a high-side driver, a high-side transistor, a capacitor, and an active diode. The level shifter receives a first signal to generate a set signal. The high-side driver is supplied by a bootstrap voltage of a bootstrap node and a floating reference voltage of a floating reference node, which controls the high-side transistor to provide an input voltage to the floating reference node according to the set signal. The capacitor is coupled between the bootstrap node and the floating reference node. The active diode provides a supply voltage to the bootstrap node. When the bootstrap voltage exceeds the supply voltage, the active diode isolates the supply voltage from the bootstrap node according to a control voltage. The active diode includes a first-type well coupled to the bootstrap node, where the high-side driver is disposed.

10 Claims, 10 Drawing Sheets

(56) References Cited

U.S. PATENT DOCUMENTS

2013/0002313 A1  1/2013  Hosokawa et al.

FOREIGN PATENT DOCUMENTS

TW    201424233 A    6/2014
TW    201505341 A    2/2015

* cited by examiner

HIGH-SIDE CIRCUITS WITH MODIFIED DIODE AND LAYOUT PLACEMENT THEREOF

CROSS REFERENCE TO RELATED APPLICATIONS

This Application claims priority of Taiwan Patent Application No. 104127103, filed on Aug. 20, 2015, the entirety of which is incorporated by reference herein.

BACKGROUND OF THE INVENTION

Field of the Invention

The disclosure relates generally to switch-mode converters and the high-side circuits, and more particularly it relates to high-side circuits with a modified diode as the bootstrap diode and the layout placement thereof.

Description of the Related Art

Figure 1:
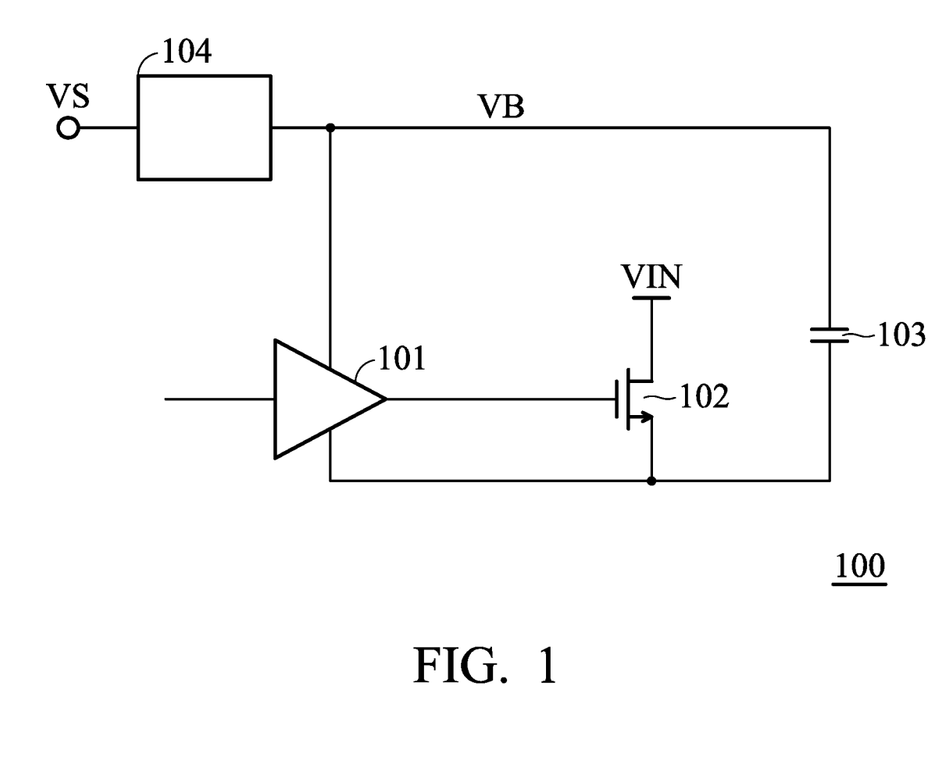
FIG. 1 shows a block diagram of the high-side circuit of a switch-mode converter in accordance with an embodiment of the invention.

In the application of switch-mode converters, the assistance of a one-way switching device and a capacitor is generally required to make the high-side transistor be fully conducted. FIG. 1 shows a block diagram of the high-side circuit of a switch-mode converter in accordance with an embodiment of the invention. As shown in FIG. 1, the high-side circuit 100 includes the high-side driver 101, the high-side transistor 102, the one-way switching device 104, and the capacitor 103. Since the input voltage VIN exceeds the supply voltage VS and the high-side transistor 102 is an N-type transistor, the one-way switching device 104 and the capacitor 103 are configured to boost the bootstrap voltage VB to the sum of the input voltage VIN and the supply voltage VS for keeping the high-side transistor 102 continuously conducted.

In addition, the one-way switching device 104 is not only configured to provide sufficient forward current from the supply voltage VS to the capacitor 103, but it is also configured to isolate the reverse current from the boosted bootstrap voltage VB to the supply voltage VS. Therefore, we need the one-way switching device 104 to be efficient and able to be integrated into the integrated circuit for improving the efficiency of circuits and reducing the cost of production.

BRIEF SUMMARY OF THE INVENTION

For solving the problems described above, the invention provides an active diode to replace the one-way switching device. The invention further integrates the active diode with a high-side circuit.

In an embodiment, a high-side circuit, which is adapted for a switch-mode converter, comprises a level shifter, a high-side driver, a high-side transistor, a capacitor, and an active diode. The level shifter comprises a first transistor. The first transistor receives a first signal to generate a set signal. The high-side driver is supplied by the bootstrap voltage of a bootstrap node and the floating reference voltage of a floating reference node and generates a high-side output signal according to the set signal. The high-side transistor provides an input voltage to the floating reference node according to the high-side output signal. The capacitor is coupled between the bootstrap node and the floating reference node. The active diode provides a supply voltage to the bootstrap node. When the bootstrap voltage exceeds the supply voltage, the active diode isolates the supply voltage from the bootstrap node according to a control voltage. The active diode further comprises a first first-type well. The first first-type well is coupled to the bootstrap node and the high-side driver is disposed in the first first-type well.

According to an embodiment of the high-side circuit, the active diode is a normally-ON transistor, wherein, when the floating reference node is coupled to a ground, the normally-ON transistor determines a forward current flowing from the supply voltage to the capacitor according to the control voltage, such that the capacitor stores a voltage difference, wherein, when the input voltage is supplied to the floating reference node, the bootstrap voltage is the sum of the input voltage and the voltage difference, and the normally-ON transistor isolates the supply voltage from the bootstrap node according to the control voltage.

According to an embodiment of the high-side circuit, a first terminal of the first transistor outputs the set signal and the first terminal of the first transistor is disposed in a second first-type well, wherein a second-type isolation ring is disposed between the first first-type well and the second first-type well.

According to an embodiment of the high-side circuit, the level shifter further comprises a second transistor. The second transistor receives a second signal to generate a reset signal. The high-side driver controls the high-side transistor to provide the input voltage to the floating reference node according to the reset signal.

According to an embodiment of the high-side circuit, a first terminal of the second transistor outputs the reset signal and the first terminal of the second transistor is disposed in a third first-type well. The second-type isolation ring is disposed between the first first-type well and the third first-type well.

According to an embodiment of the high-side circuit, the active diode is a first-type normally-ON transistor, wherein each of the first transistor and the second transistor is a first-type normally-OFF transistor.

According to an embodiment of the high-side circuit, the first-type normally-ON transistor is a first-type depletion transistor or a first-type junction gate field-effect transistor, and the first-type normally-OFF transistor is a first-type enhancement transistor.

According to an embodiment of the high-side circuit, the high-side circuit further comprises a control logic. The control logic is supplied by the supply voltage and generates the first signal and the second signal according to an input signal. Each of the first signal and the second signal is ranging from the supply voltage to a ground level of the ground.

According to an embodiment of the high-side circuit, the level shifter further comprises: a first resistive device and a second resistive device. The first resistive device is coupled between the bootstrap node and the first transistor and configured to generate the set signal. The second resistive device is coupled between the bootstrap node and the second transistor and configured to generate the reset signal. The first resistive device and the second resistive device are disposed in the first first-type well. The high-side driver further comprises: a high-side control circuit and a high-side driving device. The high-side control circuit receives the set signal and the reset signal to generate a high-side driving signal. The high-side driving device controls the high-side transistor to provide the input voltage to the floating reference node according to the high-side driving signal.

According to an embodiment of the high-side circuit, the high-side driver further comprises: a P-type transistor and an N-type transistor. A gate terminal of the P-type transistor receives the high-side driving signal, a source terminal of the P-type transistor is coupled to the bootstrap node, and the drain terminal of the P-type transistor outputs the high-side output signal. The high-side output signal is configured to control the high-side transistor to provide the input voltage to the floating reference node. A gate terminal of the N-type transistor receives the high-side driving signal, a source terminal of the N-type transistor is coupled to the floating reference node, and a drain terminal of the N-type transistor outputs the high-side output signal.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
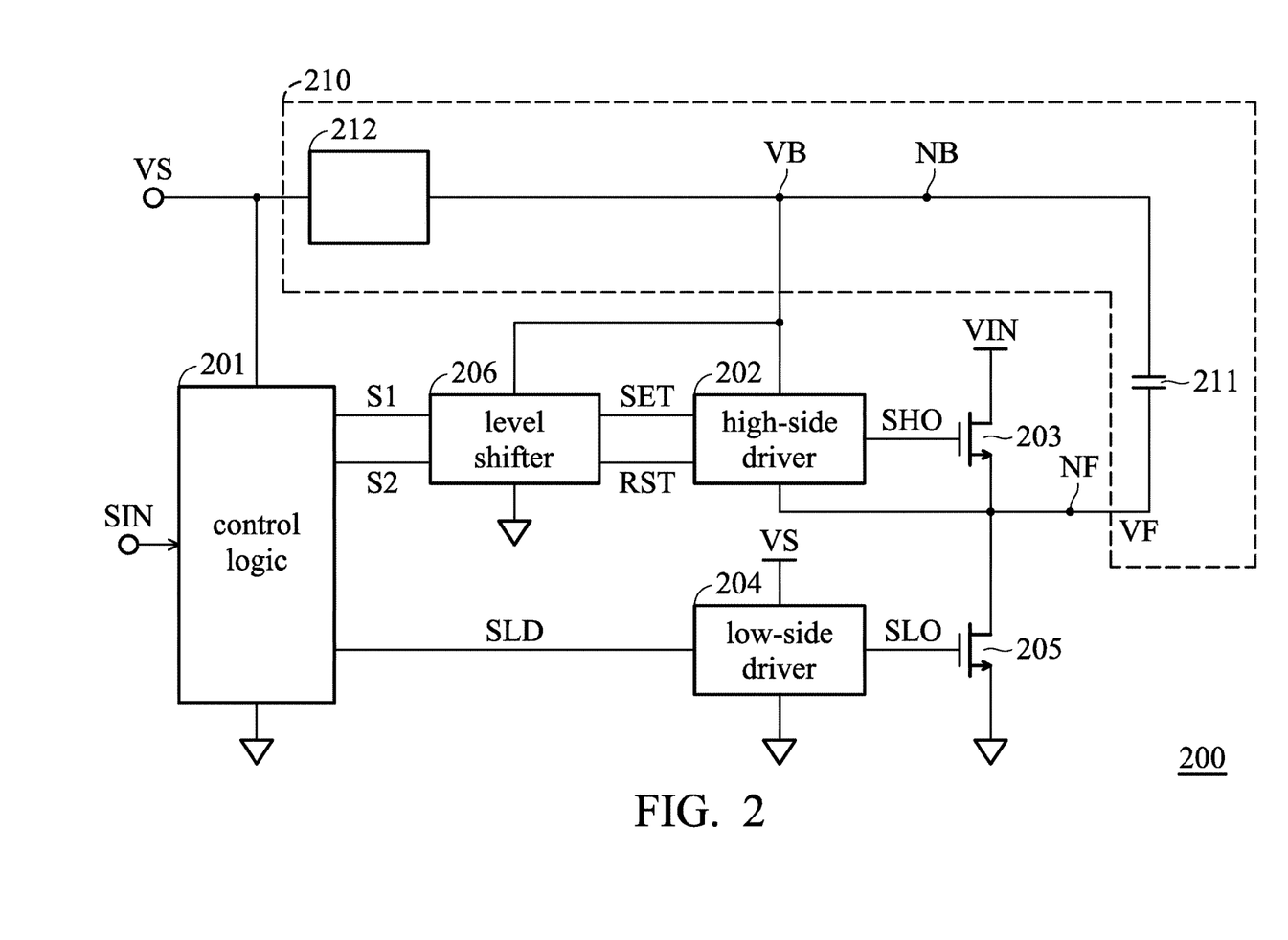
FIG. 2 is a block diagram of a switch-mode converter in accordance with an embodiment of the invention.

FIG. 2 is a block diagram of a switch-mode converter in accordance with an embodiment of the invention. As shown in FIG. 2, the switch-mode converter 200 includes the control logic 201, the high-side driver 202, the high-side transistor 203, the low-side driver 204, the low-side transistor 205, the level shifter 206 and the bootstrap device 210, in which the input voltage VIN exceeds the supply voltage VS. According to an embodiment of the invention, the high-side driver 202, the high-side transistor 203, the level shifter 206, and the bootstrap device 210 are corresponding to the high-side circuit 100 in FIG. 1.

According to an embodiment of the invention, the switch-mode converter 200 is a half-bridge driver. According to another embodiment of the invention, the switch-mode converter 200 is a switch-mode buck converter. According to other embodiments of the invention, the switch-mode converter 200 is any other type of converter, in which the input voltage VIN exceeds the supply voltage VS.

As shown in FIG. 2, the control logic 201 is supplied by the supply voltage VS and generates the first signal S1 and the second signal S2 to the level shifter 206 according to the input signal SIN. The level shifter 206 operates between the bootstrap voltage VB and the ground voltage of the ground and converts the first signal S1 and the second signal S2 ranging from the supply voltage and the ground voltage to the set signal SET and the reset signal RST ranging from the bootstrap voltage VB and the floating reference voltage VF.

The high-side driver 202 receives the bootstrap voltage VB of the bootstrap node NB and the floating reference voltage VF of the floating reference node NF, and generates, according to the high-side driving signal SHD, the high-side output signal SHO to control the high-side transistor 203. According to an embodiment of the invention, the voltage level of the high-side output signal SHO is between the bootstrap voltage VB and the floating reference voltage VF.

The control logic further generates the low-side driving signal SLD to the low-side driver 204. The low-side driver 204 is supplied by the supply voltage VS and generates, according to the low-side driving signal SLD, the low-side output signal SLO to control the low-side transistor 205. According to an embodiment of the invention, when the low-side driver 204 controls the low-side transistor 205 to be turned ON by the low-side output signal SLO, the high-side driver 202 controls the high-side transistor 203 to be turned OFF by the high-side output signal SHO. The floating reference node NF is coupled to the ground through the low-side transistor 205, such that the floating reference voltage VF is 0V. The high-side driver 202 and the low-side driver 204 will be described in the following description.

According to another embodiment of the invention, when the low-side driver 204 controls the low-side transistor 205 to be turned OFF, the high-side driver 202 controls the high-side transistor 203 to be turned ON for supplying the input voltage VIN to the floating reference node NF, such that the floating reference voltage VF is equal to the input voltage VIN. Since the high-side transistor 203 and the low-side transistor 205 are made by the same device, the boost device 210 boosts the bootstrap voltage VB to the sum of the supply voltage VS and the input voltage VIN for keeping an identical gate-drain voltage in each of the high-side transistor 203 and low-side transistor 205.

As shown in FIG. 2, the boost device 210 includes the capacitor 211 and the one-way switching device 212. The capacitor 211 is coupled between the bootstrap node NB and the floating reference node NF. The one-way switching device 212 is coupled between the supply voltage VS and the bootstrap node NB. According to an embodiment of the invention, when the bootstrap voltage VB is less than the supply voltage VS, the one-way switching device 212 supplies the supply voltage VS to the bootstrap node NB.

According to another embodiment of the invention, when the bootstrap voltage VB exceeds the supply voltage VS, the one-way switching device 212 isolates the supply voltage VS from the bootstrap node NB for preventing the supply voltage VS from the excessively high bootstrap voltage VB from breaking down other circuits. The boost device 210 will be described in the following description.

Figure 3:
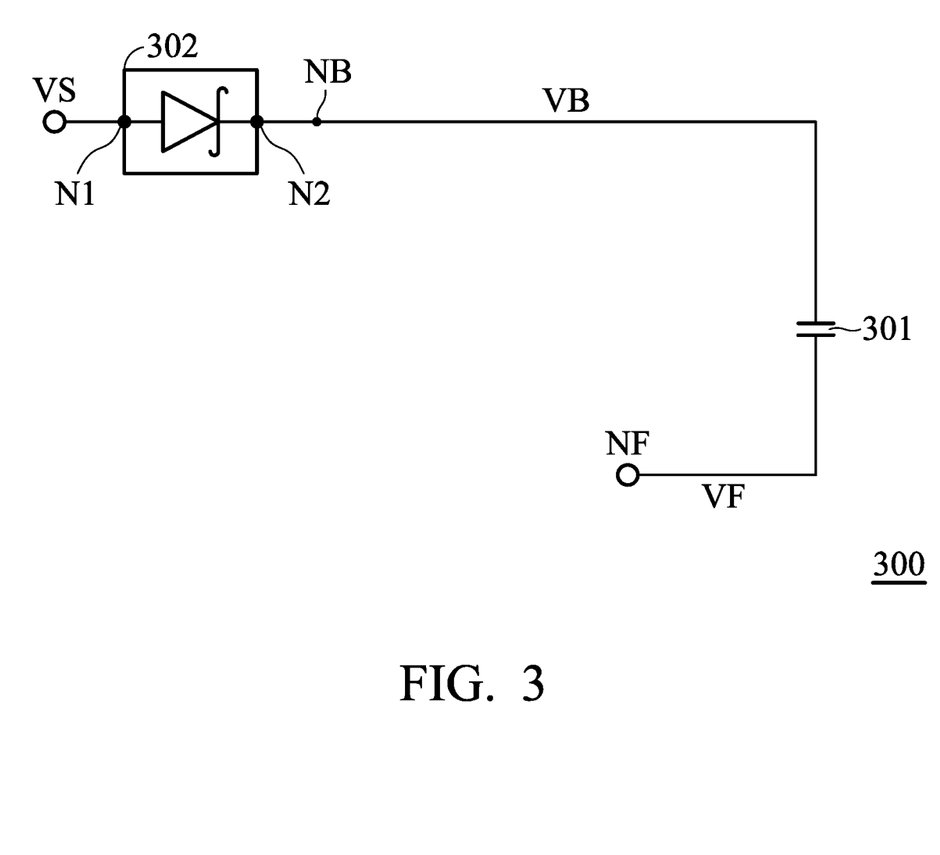
FIG. 3 is a schematic diagram of a boost device in accordance with an embodiment of the invention.

FIG. 3 is a schematic diagram of a boost device in accordance with an embodiment of the invention. As shown in FIG. 3, the boost device 300 includes the capacitor 301 and the Schottky diode 302, in which the Schottky diode 302 includes the anode terminal N1 and the cathode terminal N2.

The anode terminal N1 receives the supply voltage VS, and the cathode terminal N2 is coupled to the bootstrap node NB. Compared to FIG. 2, the one-way switching device 212 is replaced by the Schottky diode 302.

According to an embodiment of the invention, when the floating reference node NF is coupled to the ground, the supply voltage VS exceeds the bootstrap voltage VB and the Schottky diode 302 is turned ON, such that the supply voltage VS charges the capacitor 301 and the voltage difference stored in the capacitor 301 is equal to the supply voltage VS. When the input voltage VIN is applied to the floating reference node NF through the high-side transistor 203 in FIG. 2, the floating reference voltage VF is equal to the input voltage VIN. Since the voltage difference stored in the capacitor 301 is the supply voltage VS, the bootstrap voltage VB is the sum of the supply voltage VS and the input voltage VIN.

For increasing the forward current of the Schottky diode 302 flowing to the capacitor 301, the contact area between the metal layer and the doping layer of the Schottky diode 302 should be increased. However, after increasing the contact area between the metal layer and the doping layer, the reverse current of the Schottky diode 302 is increased accordingly, such that the Schottky diode 302 is not able to effectively isolate the bootstrap voltage VB from the supply voltage VS when the bootstrap voltage VB exceeds the supply voltage VS. Therefore, even though the Schottky diode 302 can be utilized as a one-way switching device 212, the performance of the Schottky diode 302 is limited due to the limitations imposed by the Schottky diode's physical characteristics.

Figure 4:
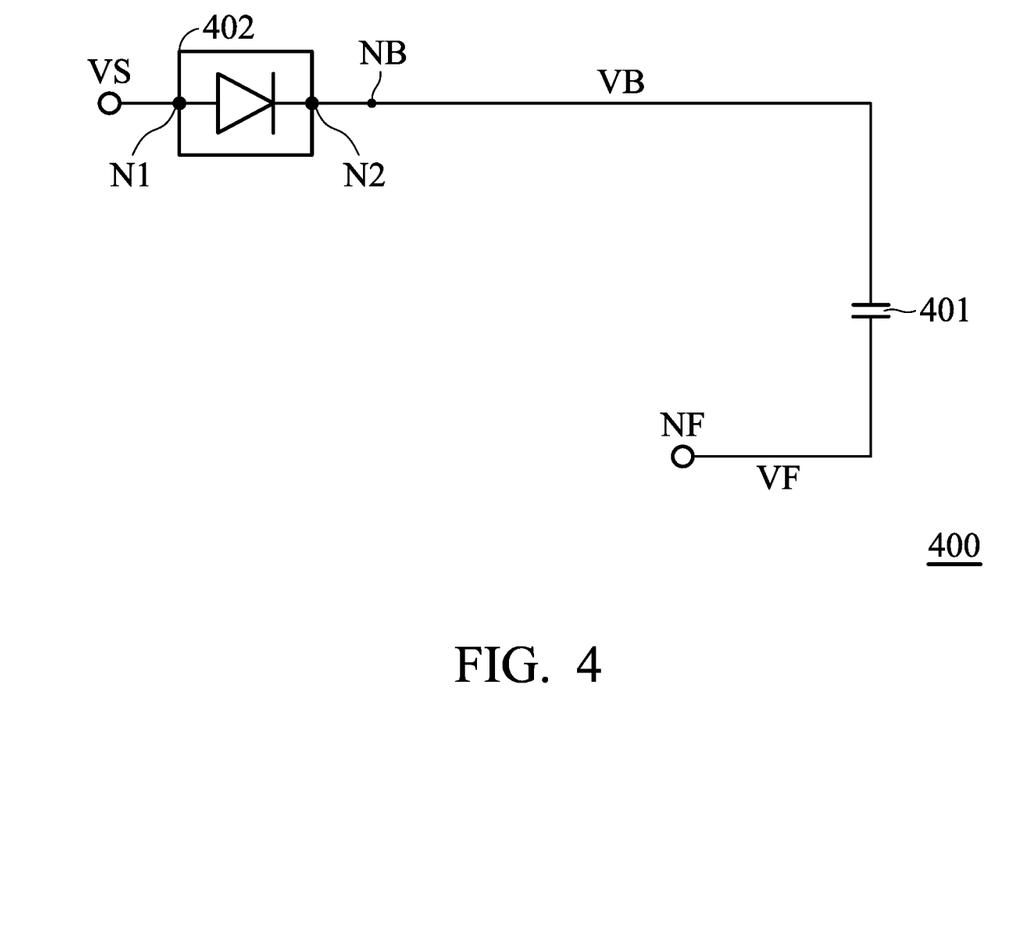
FIG. 4 is a schematic diagram of a boost device in accordance with another embodiment of the invention.

FIG. 4 is a schematic diagram of a boost device in accordance with another embodiment of the invention. As shown in FIG. 4, the boost device 400 includes the capacitor 401 and the body-isolated diode 402, in which the body-isolated diode 402 includes the anode terminal N1 and the cathode terminal N2. The anode terminal N1 receives the supply voltage VS, and the cathode terminal N2 is coupled to the bootstrap terminal NB. Compared to FIG. 2, the one-way switching device 212 is replaced by the body-isolated diode 402.

Even though the body-isolated diode 402 provides better isolation performance than the Schottky diode 302 does, a power loss may be caused by part of the forward current, which flows from the supply voltage VS to the capacitor 401, flowing to the P-type substrate when the body-isolated diode 402 is forward-biased, since the body-isolated diode 402 is placed upon the P-type substrate.

Figure 5:
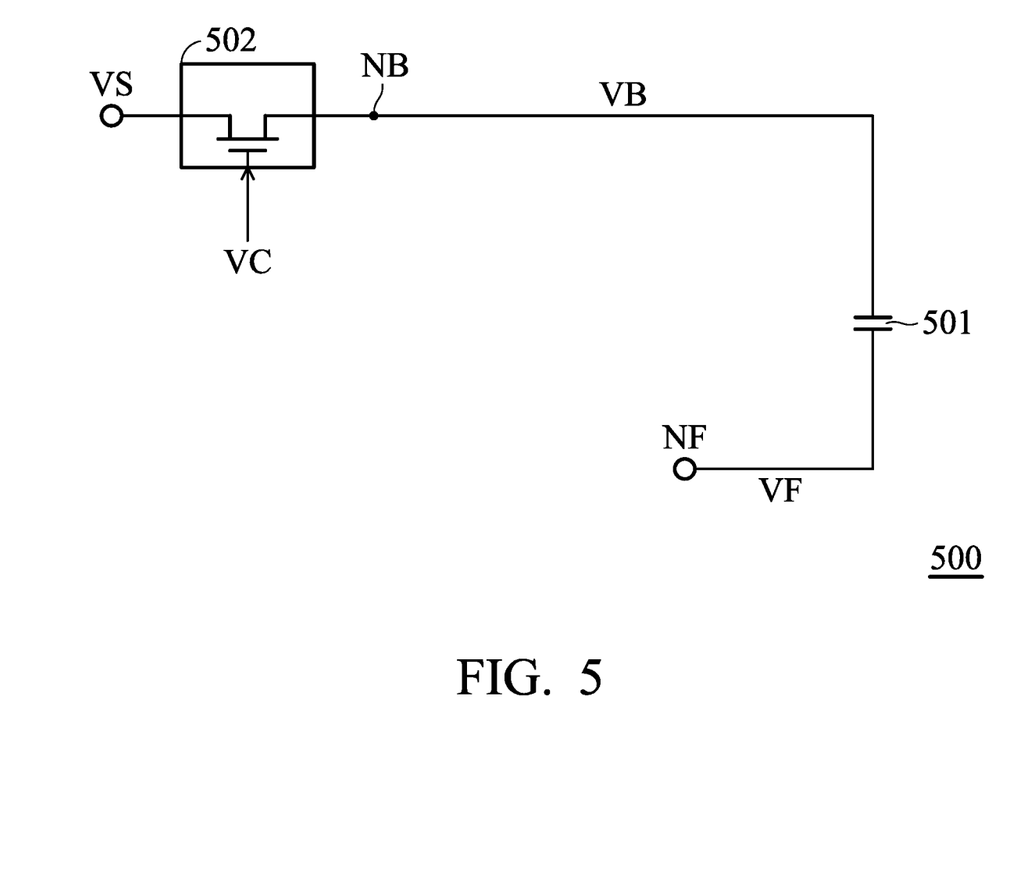
FIG. 5 is a schematic diagram of a boost device in accordance with another embodiment of the invention.

FIG. 5 is a schematic diagram of a boost device in accordance with another embodiment of the invention. As shown in FIG. 5, the boost device 500 includes the capacitor 501 and the active diode 502, in which the active diode 502 is coupled between the supply voltage and the bootstrap node NB and controlled by the control voltage VC. Compared to FIG. 2, the one-way switching device 212 is replaced by the active diode 502.

According to an embodiment of the invention, the active diode 502 is an N-type depletion transistor. According to another embodiment of the invention, the active diode 502 is an N-type junction gate field-effect transistor (JFET). According to yet another embodiment of the invention, the active diode 502 can be a P-type depletion transistor or a P-type junction gate field-effect transistor. According to other embodiments of the invention, the active diode 502 is a normally-ON transistor which has been invented or will be invented in the future.

Figure 6:
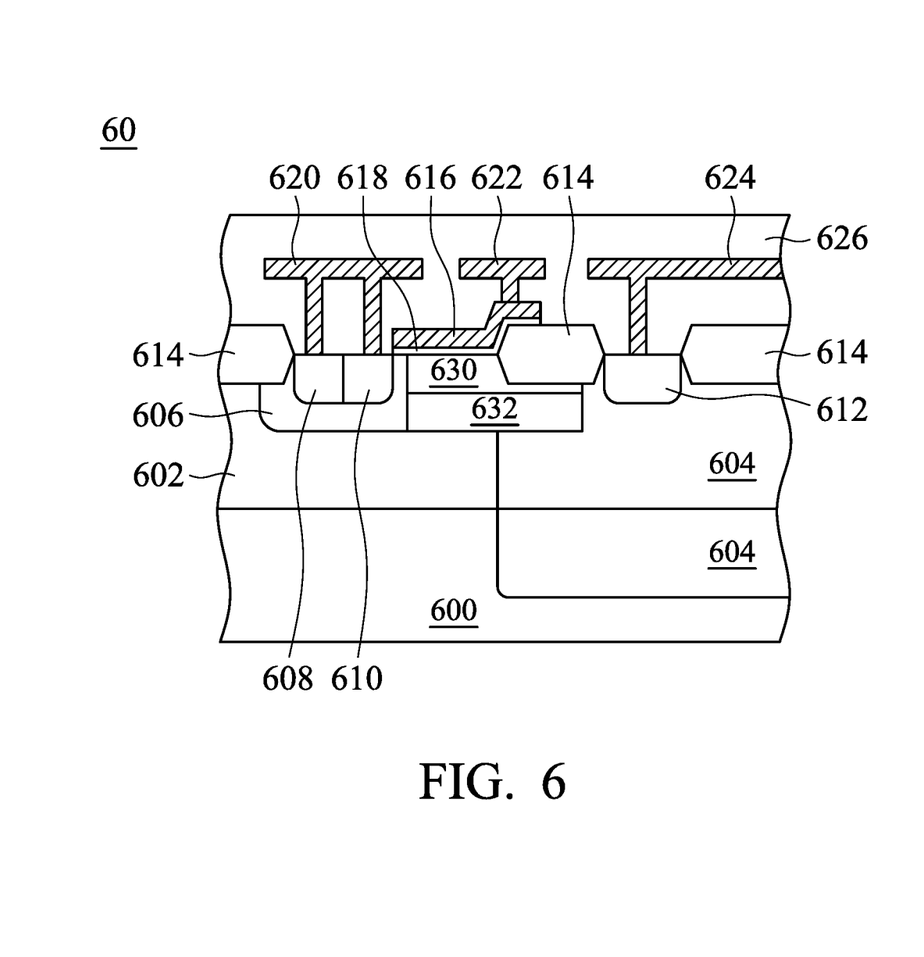
FIG. 6 is a cross-sectional view of a normally-ON transistor in accordance with an embodiment of the invention.

FIG. 6 is a cross-sectional view of a normally-ON transistor in accordance with an embodiment of the invention. The normally-ON transistor 60 is an N-type device and includes a P-type substrate 600 and an epitaxial layer 602 disposed on the P-type substrate 600. According to another embodiment of the invention, the normally-ON transistor 60 may be a P-type device, and the N-type device is illustrated herein but not limited thereto. A gate structure 616 and a field insulating layer 614 are on the epitaxial layer 602. A gate insulating layer 618 is disposed between the gate structure 616 and the field insulating layer 614. A portion of the gate insulating layer 618 extends to cover a portion of the field insulating layer 614.

Moreover, a P-type body region 606 and an N-type well region 604 are respectively disposed in the epitaxial layer 602 on either side of the gate structure 616. The N-type well region 604 is disposed in both the substrate 600 and the epitaxial layer 602. A P-type contact region 608 and an adjacent N-type contact region 610 collectively constitute a source region, which is disposed in the body region 606. An N-type contact region 612 constitutes a drain region and is disposed in the N-type well region 604. Moreover, a P+ doped region 632 is disposed in the N-type well region 604 and extends outside of the N-type well region 604 toward the body region 606. The normally-ON transistor 60 further includes an N+ doped region 430 stacked on the P+ doped region 632. The N+ doped region 630 is also disposed in the N-type well region 604 and extends outside of the N-type well region 604 toward the body region 606. In some embodiments of the invention, the N+ doped region 630 and the P+ doped region 632 may be extended to overlap a portion of the body region 606, but are not in contact with the source regions 608/610. In some embodiments of the invention, the N+ doped region 630 and the P+ doped region 632 may be extended outside of the N-type well region 604 but do not overlap the body region 606.

Moreover, the normally-ON transistor 60 further includes a source electrode 620 electrically connected to the P-type contact region 608 and the N-type contact region 610. A drain electrode 624 is electrically connected to the N-type contact region 612. A gate electrode 622 is electrically connected to the gate structure 616. An interlayer dielectric layer 626 is disposed to cover the source electrode 620, the gate electrode 622, and the drain electrode 624.

Figure 7:
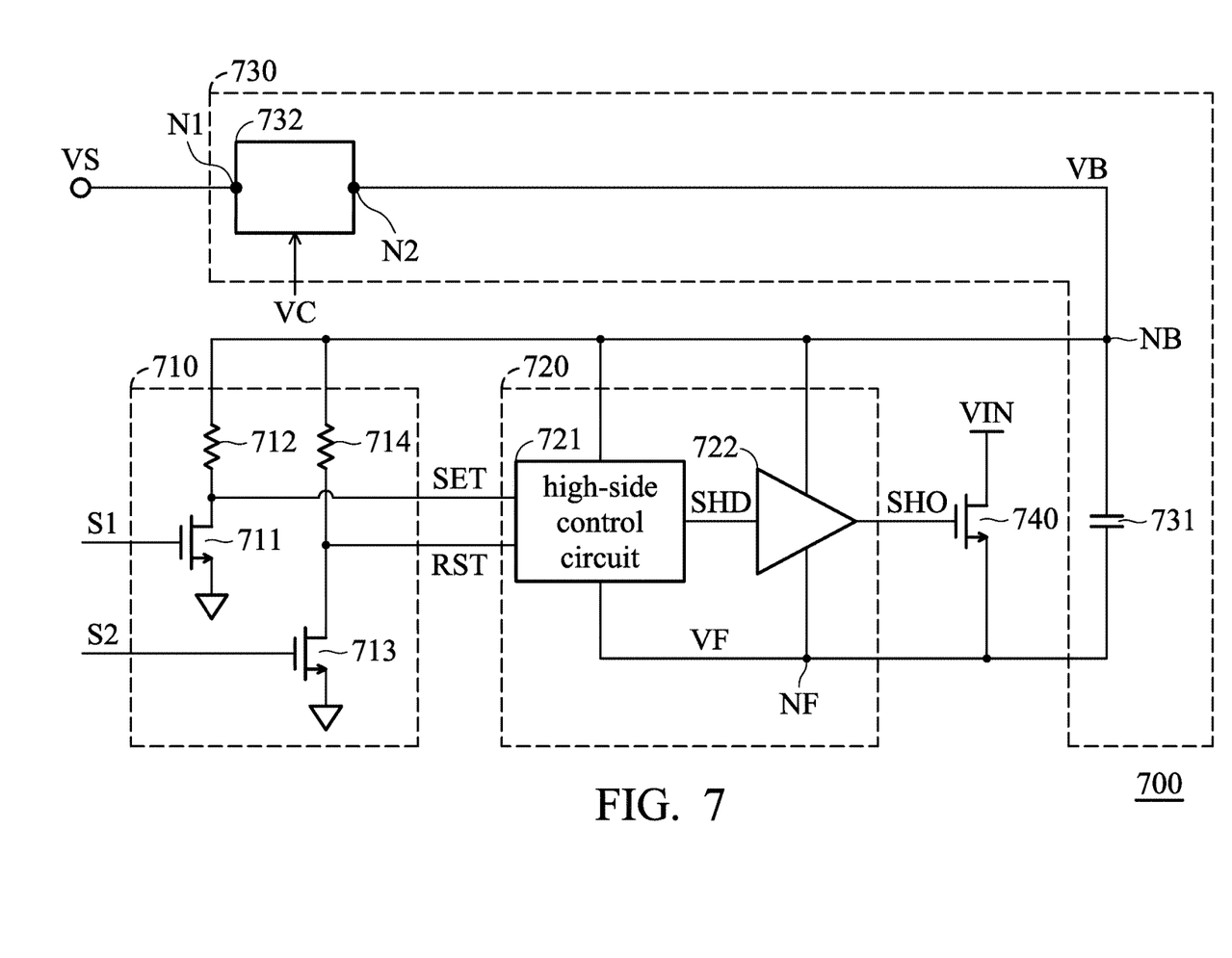
FIG. 7 is a schematic diagram of the high-side circuit in FIG. 2 in accordance with an embodiment of the invention.

FIG. 7 is a schematic diagram of the high-side circuit in FIG. 2 in accordance with an embodiment of the invention. As shown in FIG. 7, the high-side circuit 700 includes the level shifter 710, the high-side driver 720, the bootstrap device 730, and the high-side transistor 740. According to an embodiment of the invention, the level shifter 710 and the high-side driver 720 in FIG. 7 are illustrated herein and may also be any kind of circuit which is configured to drive the high-side transistor 203 in FIG. 2.

According to an embodiment of the invention, the level shifter 710 includes the first transistor 711, the first resistive device 712, the second transistor 713, and the second resistive device 714, in which the first transistor 711 and the second transistor 713 are normally-OFF transistors. According to an embodiment of the invention, the first transistor 711 and the second transistor 713 are N-type enhancement transistors. According to another embodiment of the invention, the first transistor 711 and the second transistor 714 are P-type enhancement transistors, and the level shifter 710 should be modified accordingly. The N-type transistor is illustrated herein but not limited thereto.

The first transistor 711 and the first resistive device 712 generates, according to the first signal S1 generated by the control logic 201 in FIG. 2, the set signal SET, in which the high logic level of the set signal SET is the bootstrap voltage VB and the low logic level is the floating reference voltage VF. Likewise, the second transistor 713 and the second resistive device 714 generates, according to the second signal S2 generated by the control logic 201 in FIG. 2, the reset signal RST, in which the high logic level of the reset signal RST is the bootstrap voltage VB and the low logic level of the reset signal RST is the floating reference voltage VF.

The high-side driver 720 is supplied by the bootstrap voltage VB and the floating reference voltage VF, and further includes the high-side control circuit 721 and the high-side driving device 722. The high-side control circuit 721 generates the high-side driving signal SHD according to the set signal SET and the reset signal RST generated by the level shifter 710. The high-side driving device 722 generates the high-side output signal SHO according to the high-side driving signal SHD, in which the high-side output signal SHO is configured to control the high-side transistor 740 to supply the input voltage VIN to the floating reference node NF.

The bootstrap device 730 is configured to boost the bootstrap voltage VB to the sum of the supply voltage VS and the input voltage VIN, in which the bootstrap device 730 includes the capacitor 731 and the normally-ON transistor 732. The normally-ON transistor 732 includes the anode terminal N1 and the cathode terminal N2, in which the anode terminal N1 is configured to receive the supply voltage VS and the cathode terminal N2 is coupled to the bootstrap node NB. The normally-ON transistor 732 controls the forward current flowing from the supply voltage VS to the capacitor 731 according to the control voltage VC. When the bootstrap voltage VB exceeds the supply voltage VS, the normally-ON also controls the reverse current flowing from the bootstrap voltage VB to the supply voltage VS according to the control voltage VC.

Figure 8:
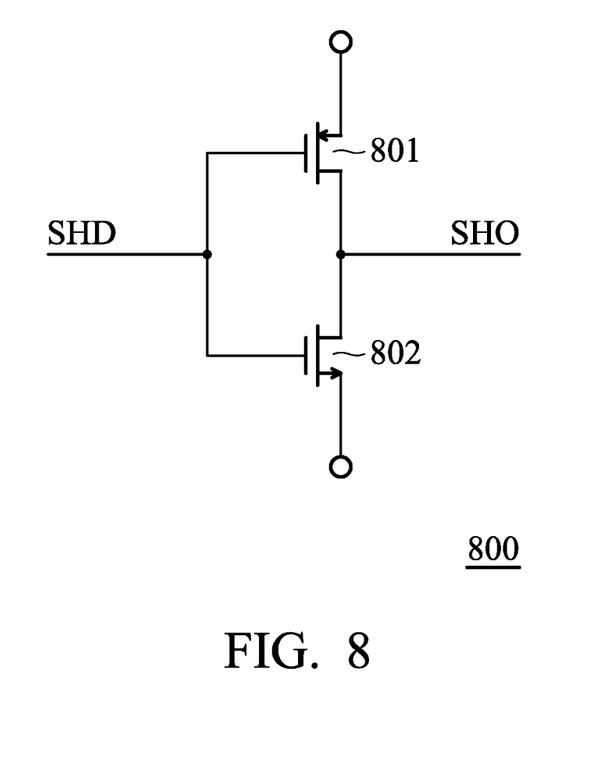
FIG. 8 is a schematic diagram of the high-side driving device 722 in FIG. 7 in accordance with an embodiment of the invention.

FIG. 8 is a schematic diagram of the high-side driving device 722 in FIG. 7 in accordance with an embodiment of the invention. As shown in FIG. 8, the high-side driver 800 includes the P-type transistor 801 and the N-type transistor 802. The gate terminal of the P-type transistor 801 receives the high-side driving signal SHD, the source terminal of the P-type transistor 801 is coupled to the bootstrap node NB, and the drain terminal of the P-type transistor 801 outputs the high-side output signal SHO. The gate terminal of the N-type transistor 802 receives the high-side driving signal SHD, the source terminal of the N-type transistor 802 is coupled to the floating reference node NF, and the drain terminal of the N-type transistor 802 outputs the high-side output signal SHO.

Figure 9:
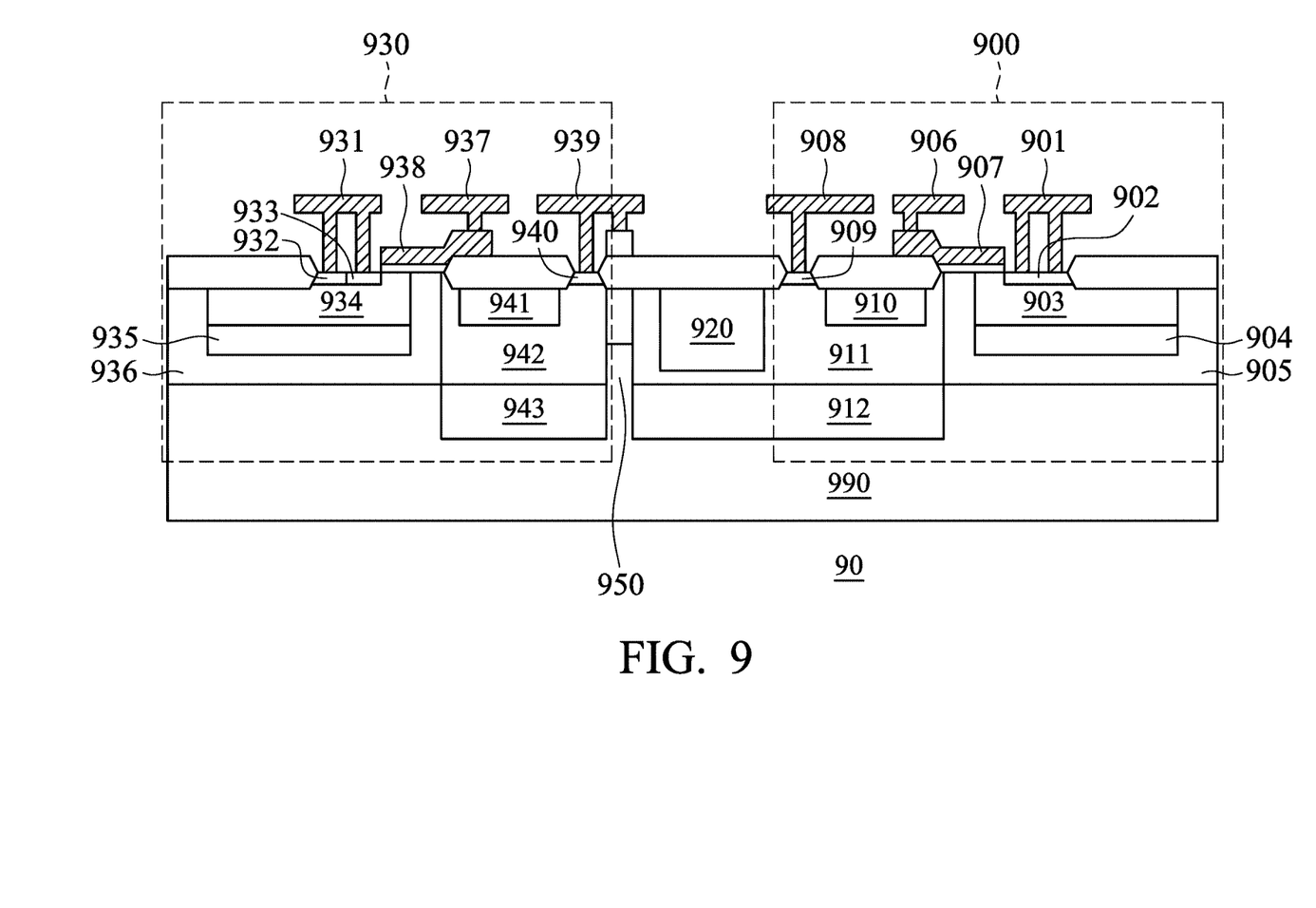
FIG. 9 is a layout cross-sectional view of the level shifter 710, the high-side driver 720, and the normally-ON transistor 732 in accordance with an embodiment of the invention.

FIG. 9 is a layout cross-sectional view of the level shifter 710, the high-side driver 720, and the normally-ON transistor 732 in accordance with an embodiment of the invention. According to an embodiment of the invention, the layout structure 90 is a cross-sectional view which is illustrated by the first transistor 711 and the second transistor 712 being N-type enhancement transistors and the normally-ON transistor 732 being an N-type depletion transistor. According to another embodiment of the invention, the first transistor 711 and the second transistor 712 may also be P-type enhancement transistors, and the normally-ON transistor 732 may also be a P-type depletion transistor. As shown in FIG. 9, the layout structure 90 includes the level shifter 710, the high-side driver 720, and the normally-ON transistor 732.

As shown in FIG. 9, the first device 900 and the second device 930 are both placed on the P-type substrate 990. The first device 900 includes the first electrode 901, the first P+ doping layer 902, the first P-type well 903, the first P-type buried layer 904, the first P-type epitaxial layer 905, the first gate electrode 906, the first gate structure 907, the second electrode 908, the first N+ doping area 909, the first P-type doping area (PTOP) 910, the first N-type well 911, and the first N-type deep well 912.

As shown in FIG. 9, the first P-type epitaxial 905 and the first N-type deep well 912 are placed on the P-type substrate 990, the first P-type buried layer 904 is disposed on the first epitaxial layer 905, and the first P-type well 903 is disposed on the first P-type buried layer 904. The first P+ doping layer 902 is disposed on the first P-type well 903 and is also coupled to the first electrode 901. The first gate electrode 906 is coupled to the first gate structure 907. The first N-type well 911 is disposed on the first N-type deep well 912, the first N+ doping area 909 and the first P+ doping area 910 are disposed on the first N-type well 911, and the first N+ doping area 909 is coupled to the second electrode 908, in which the first P-type doping area 910 is configured to reduce the field on the surface.

According to an embodiment of the invention, the first device 900 is corresponding to the normally-ON transistor 732 in FIG. 7. Therefore, the first electrode 901 is the anode terminal N1 of the normally-ON transistor 732 in FIG. 7 which is configured to be supplied by the supply voltage VS. The second electrode 908 is the cathode terminal N2 of the normally-ON transistor 732 in FIG. 7 which is configured to be coupled to the bootstrap node NB. The first gate electrode 906 is configured to receive the control voltage VC.

Since the second electrode 908 is coupled to the bootstrap node NB, the high-side driver 720 and the first resistive device 712 and the second resistive device 714 of the level shifter 710 are placed in the first N-type well 911, which is in the block 920. According to another embodiment of the invention, any other circuit, which is configured to receive the first signal S1 and the second signal S2 in FIG. 2 to drive the high-side transistor 203 in FIG. 2, may be disposed in the block 920.

The second device 930 includes the third electrode 931, the second P+ doping layer 932, the second N+ doping layer 933, the second P-type well 934, the second P-type buried layer 935, the second P-type epitaxial layer 936, the second gate electrode 937, the second gate structure 938, the fourth electrode 939, the third N+ doping area 940, the second P-type doping area (PTOP) 941, the second N-type well 942, and the second N-type deep well 943.

The difference between the second device 930 and the first device 900 is that the second P+ doping layer 932 and the second N+ doping layer 933 are disposed on the second P-type well 934, and the second P+ doping layer 932 is adjacent to the second N+ doping layer 933. According to an embodiment of the invention, the second device 930 is corresponding to the first transistor 711 in FIG. 7. Therefore, the third electrode 931 is the source terminal of the first transistor 711 in FIG. 7 which is coupled to the ground. The fourth electrode 939 is the drain terminal of the first transistor 711 in FIG. 7 which is configured to output the set signal SET. The second gate electrode 937 is the gate terminal of the first transistor 711 which receives the first signal S1.

According to another embodiment of the invention, the second device 930 is corresponding to the second transistor 713 in FIG. 7. Therefore, the third electrode 931 is the source terminal of the second transistor 713 in FIG. 7 which is coupled to the ground. The fourth electrode 939 is the drain terminal of the second transistor 713 in FIG. 7 which is configured to output the reset signal RST. The second gate electrode 937 is the gate terminal of the second transistor 713 which is configured to receive the second signal S2.

According to an embodiment of the invention, since the second electrode 908 and the fourth electrode 939 have different voltage level, the P-type isolation ring 940 is disposed between the first N-type well 911 and the second N-type well 942 and between the first N-type deep well 912 and the second N-type deep well 943, which is configured to isolate the first N-type well 911 from the second N-type well 942 and to isolate the first N-type deep well 912 and the second N-type deep well 943.

Figure 10:
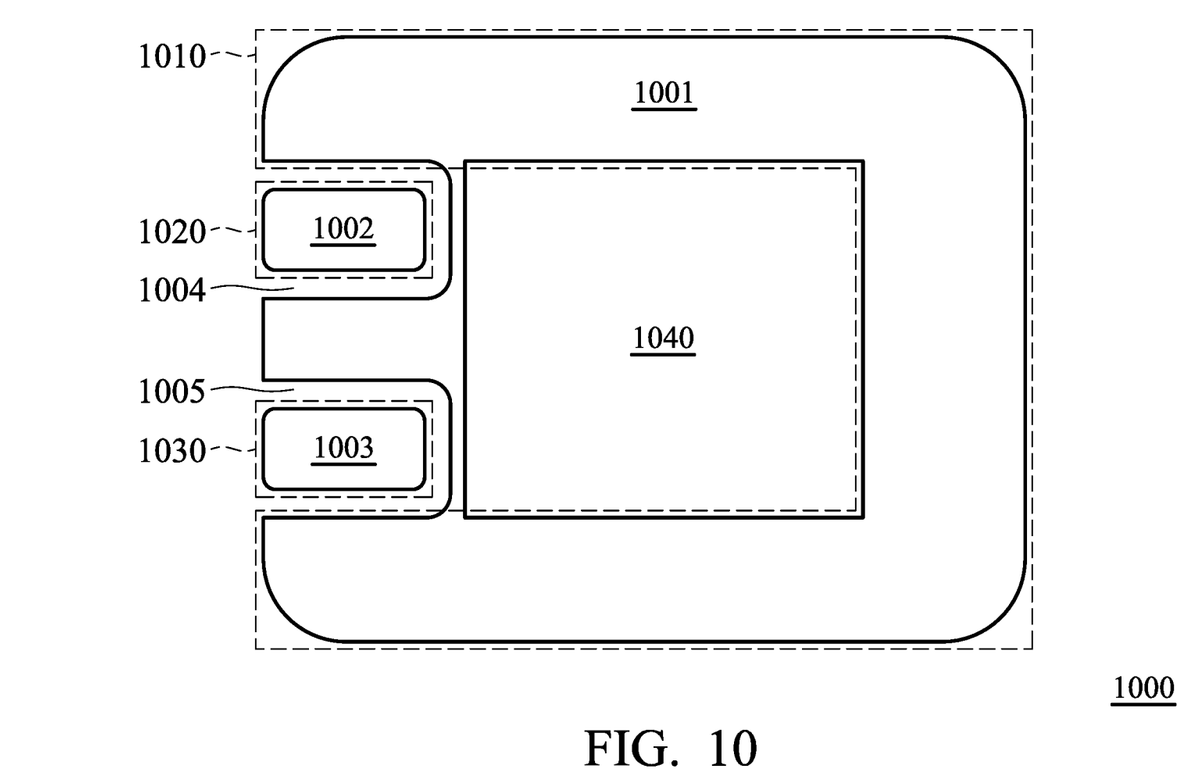
FIG. 10 is a layout top view of the level shifter 710, the high-side driver 720, and the normally-ON transistor 732 in FIG. 7 in accordance with an embodiment of the invention.

FIG. 10 is a layout top view of the level shifter 710, the high-side driver 720, and the normally-ON transistor 732 in FIG. 7 in accordance with an embodiment of the invention. As shown in FIG. 10, the layout 1000 includes the first N-type well 1001, the second N-type well 1002, the third N-type well 1003, the first P-type isolation ring 1004, and the second P-type isolation ring 1005, in which the first semiconductor device 1010 is corresponding to the normally-ON transistor 732 in FIG. 7, the second semiconductor device 1020 is corresponding to the first transistor 711 in FIG. 7, and the third semiconductor device 1030 is corresponding to the second transistor 713 in FIG. 7.

According to an embodiment of the invention, since the first semiconductor device 1010 is corresponding to the normally-ON transistor 732, the first N-type well 1001 is corresponding to the first N-type well 911 in FIG. 9 which is coupled to the bootstrap node NB in FIG. 7. Since FIG. 10 is a top view, the first N-type deep well 912 in FIG. 9 is covered by the first N-type well 1001, which is not shown herein.

The block 1010 of the first N-type well 1001 is corresponding to the block 920 in FIG. 9. According to an embodiment of the invention, the high-side driver 720 and the first resistive device 712 and the second resistive device 714 of the level shifter 710 in FIG. 7 are disposed in the block 1010. According to another embodiment of the invention, any kind of circuit, which is configured to receive the first signal S1 and the second signal S2 in FIG. 2 to drive the high-side transistor 740 in FIG. 7, may be also disposed in the block 920.

According to an embodiment of the invention, since the first semiconductor device 1020 is corresponding to the first transistor 711 in FIG. 7, the second semiconductor device 1030 is corresponding to the second transistor 713 in FIG. 7, and the second device 930 in FIG. 9 is corresponding to the first transistor 711 and the second transistor 713, the second N-type well 1002 is corresponding to the second N-type well 942 of the first transistor 711 and the third N-type well 1003 is corresponding to the second N-type well 942 of the second transistor 713.

According to an embodiment of the invention, the first P-type isolation ring 1004 is configured to isolate the first N-type well 1001 from the second N-type well 1002, and the second P-type isolation ring 1005 is configured to isolate the first N-type well 1001 from the third N-type well 1003. Namely, the first P-type isolation ring 1004 is configured to isolate the first N-type well 1001, which is corresponding to the anode terminal N1 of the normally-ON transistor 732, from the second N-type well 1002, which is corresponding to the drain terminal of the first transistor 711. The second P-type isolation ring 1005 is configured to isolate the first N-type well 1001, which is corresponding to the anode terminal N1 of the normally-ON transistor 732, from the third N-type well 1003, which is corresponding to the drain terminal of the second transistor 713.

According to an embodiment of the invention, the layout 1000 is circular. According to another embodiment of the invention, the layout 1000 is a rectangle. According to other embodiments of the invention, the layout 1000 may be any geometrical shape.

Since the one-way switching device 212 is a Schottky diode or a body-isolated diode, the one-way switching device 212 may not be integrated into the integrated circuits. When the one-way switching device 212 is implemented by a normally-ON transistor, the one-way switching device 212 can be integrated with the high-side driver 202 and the level shifter 206 into an integrated circuit.

According to an embodiment of the invention, when the one-way switching device 212 is an N-type depletion transistor or an N-type junction gate field-effect transistor, the high-side driver 202 and a portion of the level shifter 206 may be disposed in the N-type well of the one-way switching device 212, such that the area of the layout of the high-side circuit may not be increased, resulting in a reduction of the manufacturing cost. In addition, when using the normally-ON transistor as the one-way switching device 212, the forward current could be adjusted by controlling the control voltage VC, so that the performance of the circuit is accordingly improved.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A high-side circuit, adapted for a switch-mode converter, comprising:
    a level shifter, comprising a first transistor, wherein the first transistor receives a first signal to generate a set signal;
    a high-side driver, supplied by a bootstrap voltage of a bootstrap node and a floating reference voltage of a floating reference node and generating a high-side output signal according to the set signal;
    a high-side transistor, providing an input voltage to the floating reference node according to the high-side output signal;
    a capacitor, coupled between the bootstrap node and the floating reference node; and
    an active diode, providing a supply voltage to the bootstrap node, wherein, when the bootstrap voltage exceeds the supply voltage, the active diode isolates the supply voltage from the bootstrap node according to a control voltage, wherein the active diode further comprises a first first-type well, wherein the first first-type well is coupled to the bootstrap node and the high-side driver is disposed in the first first-type well.

2. The high-side circuit of claim 1, wherein the active diode is a normally-ON transistor, wherein, when the floating reference node is coupled to a ground, the normally-ON transistor determines a forward current flowing from the supply voltage to the capacitor according to the control voltage, such that the capacitor stores a voltage difference, wherein, when the input voltage is supplied to the floating reference node, the bootstrap voltage is a sum of the input voltage and the voltage difference, and the normally-ON transistor further isolates the supply voltage from the bootstrap node according to the control voltage.

3. The high-side circuit of claim 1, wherein a first terminal of the first transistor outputs the set signal and the first terminal of the first transistor is disposed in a second first-type well, wherein a second-type isolation ring is disposed between the first first-type well and the second first-type well.

4. The high-side circuit of claim 3, wherein the level shifter further comprises:
a second transistor, receiving a second signal to generate a reset signal, wherein the high-side driver controls the high-side transistor to provide the input voltage to the floating reference node according to the reset signal.

5. The high-side circuit of claim 4, wherein a first terminal of the second transistor outputs the reset signal and the first terminal of the second transistor is disposed in a third first-type well, wherein the second-type isolation ring is disposed between the first first-type well and the third first-type well.

6. The high-side circuit of claim 5, wherein the active diode is a first-type normally-ON transistor, wherein each of the first transistor and the second transistor is a first-type normally-OFF transistor.

7. The high-side circuit of claim 6, wherein the first-type normally-ON transistor is a first-type depletion transistor or a first-type junction gate field-effect transistor, and the first-type normally-OFF transistor is a first-type enhancement transistor.

8. The high-side circuit of claim 5, further comprising:
a control logic, supplied by the supply voltage and generating the first signal and the second signal according to an input signal, wherein each of the first signal and the second signal is ranging from the supply voltage to a ground level of the ground.

9. The high-side circuit of claim 6, wherein the level shifter further comprises:
a first resistive device, coupled between the bootstrap node and the first transistor and configured to generate the set signal; and
a second resistive device, coupled between the bootstrap node and the second transistor and configured to generate the reset signal, wherein the first resistive device and the second resistive device are disposed in the first first-type well, wherein the high-side driver further comprises:
a high-side control circuit, receiving the set signal and the reset signal to generate a high-side driving signal; and
a high-side driving device, controlling the high-side transistor to provide the input voltage to the floating reference node according to the high-side driving signal.

10. The high-side circuit of claim 9, wherein the high-side driver further comprises:
a P-type transistor, wherein a gate terminal receives the high-side driving signal, a source terminal is coupled to the bootstrap node, and the drain terminal outputs the high-side output signal, wherein the high-side output signal is configured to control the high-side transistor to provide the input voltage to the floating reference node; and
an N-type transistor, wherein a gate terminal receives the high-side driving signal, a source terminal is coupled to the floating reference node, and a drain terminal outputs the high-side output signal.

\* \* \* \* \*